United States Patent
Korolev et al.

(10) Patent No.: US 9,698,762 B2
(45) Date of Patent: Jul. 4, 2017

(54) FLIP-FLOP STRUCTURE

(71) Applicant: Freescale Semiconductor, Inc., Austin, TX (US)

(72) Inventors: Vasily Vladimirovich Korolev, Solnechnogorsk (RU); Alexander Ivanovich Kornilov, Zelenograd (RU); Victor Mikhailovich Mikhailov, Zelenograd (RU)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 14/879,127

(22) Filed: Oct. 9, 2015

(65) Prior Publication Data

US 2016/0301392 A1    Oct. 13, 2016

(30) Foreign Application Priority Data

Apr. 8, 2015    (RU) ................................ 2015112670

(51) Int. Cl.
| | |
|---|---|
| *H03K 3/289* | (2006.01) |
| *H03K 3/012* | (2006.01) |
| *H03K 3/3562* | (2006.01) |

(52) U.S. Cl.
CPC ......... *H03K 3/012* (2013.01); *H03K 3/35625* (2013.01)

(58) Field of Classification Search
USPC ........ 327/199–200, 202–203, 208, 212, 214, 327/230
See application file for complete search history.

(56) References Cited

U.S. PATENT DOCUMENTS

| | | |
|---|---|---|
| 5,999,030 A | 12/1999 | Inoue |
| 6,895,061 B1 * | 5/2005 | Stong .................. H03K 3/0372 327/202 |
| 7,492,201 B2 | 2/2009 | Aksamit |
| 8,352,815 B2 | 1/2013 | Frederick, Jr. |
| 9,124,261 B2 * | 9/2015 | Kim ................ H03K 3/356173 |
| 9,306,545 B2 * | 4/2016 | Baratam ................ H03K 3/012 |
| 2007/0001731 A1 | 1/2007 | Branch et al. |
| 2013/0042158 A1 | 2/2013 | Hsieh et al. |

* cited by examiner

*Primary Examiner* — An Luu (57) ABSTRACT

A flip-flop structure comprising a master latch and a slave latch. An output of an input stage of the master latch is coupled to the output of the master latch. The input stage is arranged to drive a logical state at the output of the master latch corresponding to a logical state of the received data input signal during a first phase of a clock signal. A feedback component is arranged to sample a logical state at the output of the master latch and to drive a logical state at the output of the master latch based on the sampled logical state at the output of the master latch such that the sampled logical state is maintained, during a second phase of the clock signal.

20 Claims, 4 Drawing Sheets

FLIP-FLOP STRUCTURE

FIELD OF THE INVENTION

This invention relates to a flip-flop structure, and in particular to a flip-flop structure for use within high-speed interfaces and the like.

BACKGROUND OF THE INVENTION

In the field of synchronous digital integrated circuit (IC) devices, scan chains are a technique used in design for testing that provide a simple way to set and observe flip-flops within an IC device. Scan chains are implemented by way of scan flip-flops. Scan flip-flops are flip-flop circuits that have been adapted to include additional scan-in and scan-enable signals that enable multiple scan flip-flops to be configured into scan chains.

A link layer communications protocol is used in internal high-speed connections within computer systems and embedded systems. High speed link layer communications protocol interfaces have a working frequency in the Gigahertz range, for example 2.5 GHz or 5 GHz. A problem with developing interfaces to work at such high frequency ranges is that existing scan flip-flop structures are not capable of achieving the required operating speeds.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

In accordance with some examples of a first aspect of the invention, there is provided a flip-flop structure consisting of a master latch and a slave latch coupled in series such that an output of the master latch is coupled to a data input of the slave latch.

The master latch includes an input stage arranged to receive a data input signal. Unlike conventional flip-flop structures, set/reset circuitry is removed from the data critical path, enabling the output of the input stage to be coupled directly to the output of the master latch. In this manner, the output of the master latch is driven directly by the output of the input stage (during a sampling mode of the master latch as described in greater detail below). As a result, the delay within the data critical path may be minimized, thereby improving the setup time of the flip-flop structure and thus improving the operating speed that the flip-flop structure is capable of achieving.

Significantly, the reduction in the delay within the critical path achieved by driving the output of the master latch directly from the output of the input stage enables the flip-flop structure to operate at a working frequency in the Gigahertz range. Accordingly, a flip-flop structure is achieved that is suitable for implementing high speed connections such as a link layer communications protocol interface connections and the like.

Figure 1:
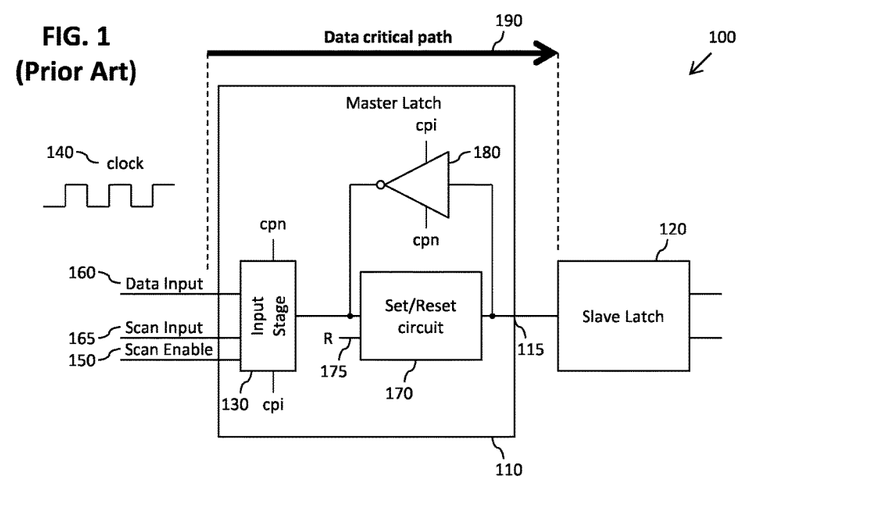
FIG. 1 schematically illustrates a simplified block diagram of a conventional scan flip-flop structure.

Referring now to FIG. 1, there is schematically illustrated a simplified block diagram of a conventional scan flip-flop structure 100. Flip-flop structures are formed by implementing two latches one after the other. A first latch, known as the master latch 110, is provided ahead of a second latch, known as the slave latch 120, in the data path.

The master latch 110 includes an input stage 130 arranged to receive two input signals 160, 165 and a scan enable signal 150. The scan enable signal 150 selectively configures one of the input signals 160, 165 as the 'active' input signal; i.e. the input signal that is sampled by the master latch 110 as described in greater detail below. A first input signal is a data input signal 160 from which a data signal is received during normal functional operation of an integrated circuit of which the flip-flop structure 100 forms a part. A second input signal is a scan input signal 165 from which a scan signal is received during a scan mode of operation when the flip-flop structure 100 is configured to form a part of a scan chain.

An output of the input stage 130 is coupled to an input of a set/reset circuit 170. An output of the set/reset circuit 170 provides the output 115 of the master latch 110. The master latch 110 further includes a feedback component 180 coupled between the output of the set/reset circuit 170 and the input of the set/reset circuit 170.

The master latch 110 is synchronised to a clock signal 140. During a first phase of the clock signal 140, for example when the clock signal 140 has, say, a high logical state, the master latch 110 is arranged to operate in a first mode in which the input stage 130 is arranged to drive a logical state at its output corresponding to the logical state of the active input signal 160, 165. As such, during the first phase of the clock signal 140, the input stage 130 may be considered to be substantially transparent such that a logical state of the active input signal 160, 165 is propagated through the input stage 130 to the set/reset circuit 170.

During operation, when the set/reset circuit 170 is not being held in a reset state by reset signal 175, the set/reset circuit 170 configures its output to a logical state based on the logical state received at its input. Accordingly, during the first phase of the clock signal 140, the set/reset circuit 170 configures its output to a logical state based on the logical state of the active input signal 160, 165 propagated through the input stage 130. Thus, in this first phase of the clock signal 140, the master latch 110 may be considered as being in a 'sampling' mode whereby the logical state of the active input signal 160, 165 is sampled and the output 115 of the master latch 110 is configured based on the sampled logical state of the active input signal 160, 165.

During a second phase of the clock signal 140, for example when the clock signal 140 has a low logical state, the master latch 110 is arranged to operate in a second, 'holding', mode in which the input stage 130 is arranged to isolate its output, thereby not driving any logical state at its output. As such, during the second phase of the clock signal 140, the input stage 130 may be considered to be substantially opaque such that the active input signal 160, 165 is not able to propagate through the input stage 130 to the set/reset circuit 170.

In this second phase of the clock signal 140, the master latch 110 is required to hold the previously sampled input signal state, independent of the present state of the input signal 160, 165. In this second, holding mode, the input stage 130 isolates its output, and as such the output of the input stage 130 is 'floating'. In order to maintain the previously sampled input signal state, the feedback component 180 is enabled during the second phase of the clock signal 140. When enabled, the feedback component 180 is arranged to sample the logical state at the output of the set/reset circuit 170, and to drive a logical state at the input of the set/reset circuit 170 that will maintain the sampled state at the output of the set/reset circuit 170.

The performance of a scan flip-flop is defined mainly by: setup time +delay time. The setup time of a flip-flop is the minimum amount of time the data input signal 160 should be held steady before a sampling clock event so that the logical state of the data input signal 160 is reliably sampled. The setup time is mainly defined by the data critical path (190 in FIG. 1) from the data input signal 160 received by the input stage 130 to the input of the slave latch 120. The data critical path 160 is defined by:

(i) delay time of the input stage 130; and
(ii) delay time of the set/reset circuit 170.

Figure 2:
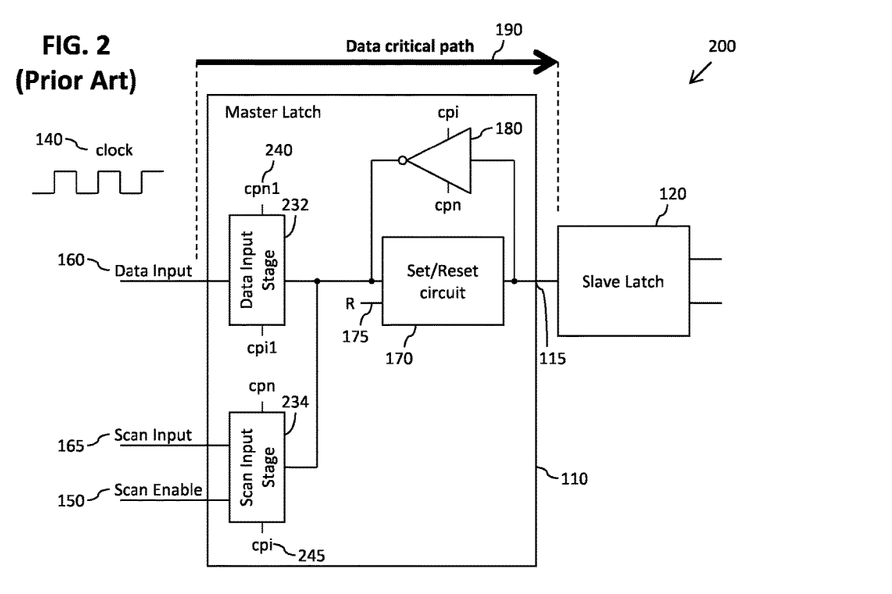
FIG. 2 schematically illustrates a simplified block diagram of a conventional level sensitive scan design flip-flop structure.

FIG. 2 schematically illustrates a simplified block diagram of a conventional level sensitive scan design (LSSD) flip-flop structure 200. In the LSSD flip-flop structure 200, the input stage has been split into two components; a first data input component 232 and a second scan input component 234. The two input components 232, 234 are provided with different timing signals 240, 245 (derived from the clock signal 140) to enable correct functionality, for example by gating the clock signal 240 provided to the data input component 232 during a scan mode of operation.

By separating the scan input component 234 from the data input component 232 in this manner, the scan input component circuitry 234 is removed from the data critical path 190. This enables the part of the input stage within the data critical path 190 (i.e. the data input component 232) to be simplified. As a result, the delay time of the input stage within the data critical path 190 may be reduced, thereby reducing the setup time of the LSSD flip-flop structure 200 as compared with the conventional flip-flop structure 100 of FIG. 1, and thus improving the performance of the LSSD flip-flop structure 200 as compared with the conventional flip-flop structure 100 of FIG. 1.

However, even the improved performance of such an LSSD flip-flop structure 200 is still not capable of achieving the required operating speeds for high-speed interfaces such as link layer communications protocol interfaces.

Figure 3:
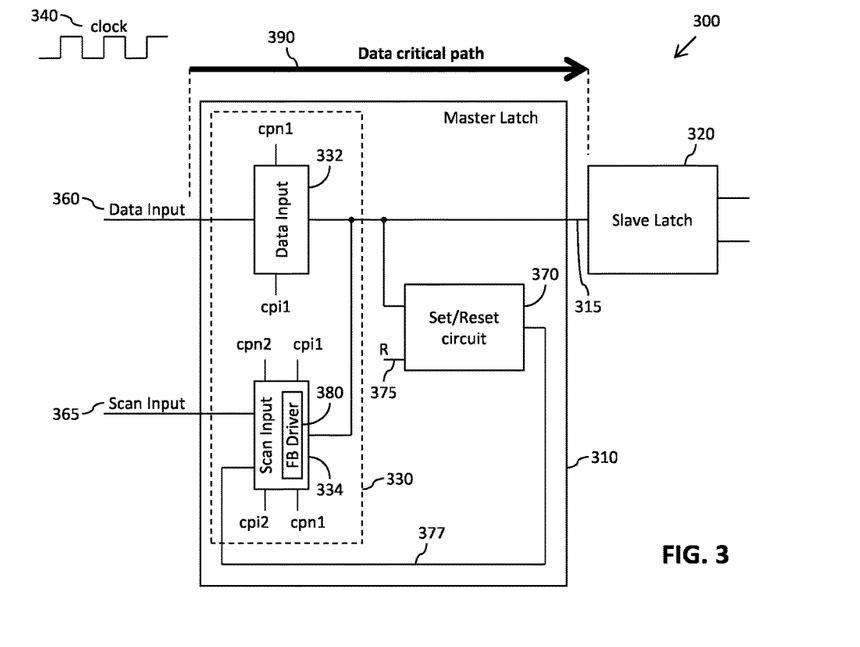
FIG. 3 schematically illustrates a simplified block diagram of a flip-flop structure.

FIG. 3 schematically illustrates a simplified block diagram of a flip-flop structure 300 adapted in accordance with some examples of the present invention. The flip-flop structure 300 includes two latches coupled in series. A first, master latch 310 is provided ahead of a second, slave latch 320 in the data path.

The master latch 310 includes an input stage 330. The input stage 330 includes a first, data, input component 332. The data input component 332 is arranged to receive at an input thereof a data signal 360 during normal functional operation of an integrated circuit of which the flip-flop structure 300 forms a part. An output of the data input component 332 is coupled to the output 315 of the master latch 310.

The master latch 310 further includes a set/reset circuit 370. Unlike for the conventional and LSSD flip-flop structures 100, 200 illustrated in FIGS. 1 and 2, the set/reset circuit 370 of the master latch 310 of the flip-flop structure 300 illustrated in FIG. 3 is not located within the critical data path 390 between the data input signal 360 and the input of the slave latch 320. As a result, the setup time of the flip-flop structure 300 illustrated in FIG. 3 is not affected by any delay of the set/reset circuit 370. Thus, the setup time of the flip-flop structure is only defined by the delay of the data input component 332. Accordingly, the setup time for the flip-flop structure 300 illustrated in FIG. 3 may be significantly reduced as compared with the setup times for the prior art flip-flop structures illustrated in FIGS. 1 and 2.

Figure 4:
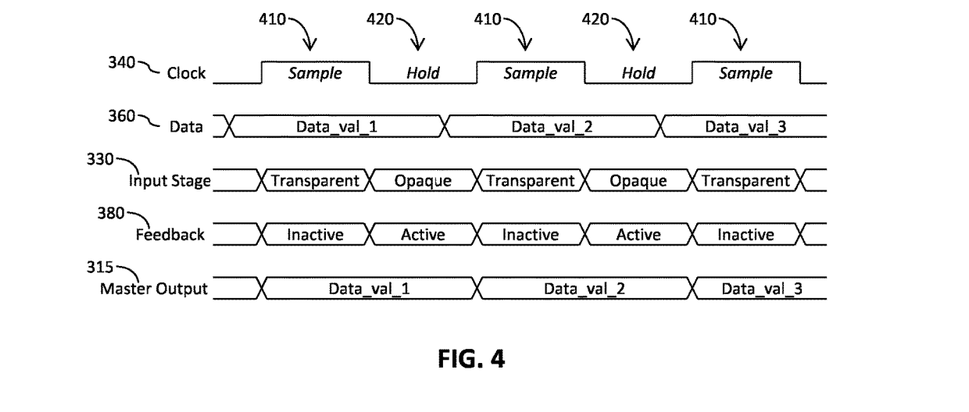
FIG. 4 illustrates a simplified timing diagram for a master latch of the flip-flop structure of FIG. 3.

The master latch 310 is synchronised to a clock signal 340. FIG. 4 illustrates a simplified timing diagram for the master latch 310 of FIG. 3 during normal functional operation of an integrated circuit of which the flip-flop structure 300 forms a part.

During a first, sampling phase 410 of the clock signal 340, when the clock signal 340 has, say, a high logical state in the illustrated example, the master latch 310 is arranged to operate in a first mode in which the input stage 330 is arranged to drive a logical state at its output corresponding to the logical state of an active input signal, for example the data input signal 360 during normal operation. As such, during the first phase 410 of the clock signal 340, the input stage 330 may be considered to be substantially transparent such that a logical state of the active input signal 360 is propagated through the input stage 330 to the output 315 of the master latch 310. Thus, in this first phase 410 of the clock signal 340, the master latch 310 may be considered as being in a 'sampling' mode whereby the logical state of the active input signal 360 is sampled and the output 315 of the master latch 310 is configured based on the sampled logical state of the active input signal 360.

During a second phase 420 of the clock signal 340, when the clock signal 340 has, say, a low logical state in the illustrated example, the master latch 310 is arranged to operate in a second, 'holding', mode in which the input stage 330 is arranged to isolate its output, thereby not driving any logical state at its output. As such, during the second phase 420 of the clock signal 340, the input stage 330 may be considered to be substantially opaque such that the active input signal 360 is not able to propagate through the input stage 330 to the output 315 of the master latch 310.

During the second phase 420 of the clock signal 340, the input stage 330 isolates its output, and as such the output of the input stage 330 is 'floating'. In order to maintain the previously sampled input signal state, a feedback component is required during the second phase 420 of the clock signal 340 to sample the logical state at the output 315 of the master latch 310, and cause a logical state to be driven at the output 315 of the master latch 310 that will maintain the sampled state at the output 315 of the master latch 310.

In the illustrated example, an input of the set/reset circuit 370 is coupled to the output 315 of the master latch 310. In this manner, the set/reset circuit 370 is arranged to sample the logical state at the output 315 of the master latch 310.

During operation, when the set/reset circuit 370 is not being held in a reset state by reset signal 375, the set/reset circuit 370 is arranged to output a feedback signal 377 having a logical state derived from the sampled logical state at the output 315 of the master latch 310. In the illustrated example, the set/reset circuit 370 consists of a first input coupled to the output 315 of the master latch 310, a second input arranged to receive the reset signal 375, and an output arranged to output the feedback signal 377. As described in greater detail below with reference to FIG. 5, the set/reset circuit 370 is arranged to drive a reset logical state at its output when the reset signal 375 consists of a first logical state, and to drive a logical state at its output based on a logical state sampled at its first input, when the reset signal 375 consists of a second logical state.

The feedback signal 377 output by the set/reset circuit 370 is provided to a feedback driver circuit 380. The feedback driver circuit 380 is arranged to drive a logical state at the output 315 of the master latch 310 based on the feedback signal 377 during the second phase 420 of the clock signal 340. In this manner, the set/reset circuit 370 and the driver circuit 380 form a feedback component of the master latch 310 arranged to, during the second phase 420 of the clock signal 340, sample the logical state at the output 315 of the master latch 310 (by the set/reset circuit 370), and cause a logical state to be driven (by the feedback driver circuit 380) at the output 315 of the master latch 310 that will maintain the sampled state at the output 315 of the master latch 310.

Advantageously, and as identified above, by removing the set/reset circuit 370 from the data critical path 390 and coupling the output of the data input component 332 substantially directly to the output 315 of the master latch 310, the delay introduced into the data critical path 390 may be reduced, thereby improving the setup time for the flip-flop structure 300

Thus, for the example illustrated in FIG. 3, a scan flip-flop structure 300 is provided consisting of a master latch 310 that enables a reduction in the setup time for the scan flip-flop 300. Furthermore, the present invention requires no changes to the slave latch 320 (apart from a reversal of the slave latch outputs in some examples as outlined in greater detail below). Accordingly, the propagation delay time for the flip-flop structure 300, i.e. the time difference from the time when the clock signal 340 changes state to the time when the output signal of the flip-flop structure 300 changes state, which is mainly defined by the slave latch 320, is unaffected.

The feedback driver circuit 380 may be implemented in any suitable manner. For example, the feedback driver circuit 380 may be implemented by way of a discrete (standalone) driver circuit coupled to the output 315 of the master latch 310, or integrated into the set/reset circuit 370. However, in the example illustrated in FIG. 3 the feedback driver circuit 380 is implemented as part of the scan input component 334, with the scan input component 334 and feedback driver circuit 380 being controlled and coordinated by way of timing signals (cpi1, cpn1, cpi2, cpn2) derived from the clock signal 340. In this manner, and as described in greater detail below with reference to FIG. 6, the feedback path may be coupled to an existing internal node of the scan input component 334. As a result, no additional capacitance is introduced at the output 315 of the master latch 310. Accordingly, by implementing the feedback driver circuit 380 as part of the scan input component 334, the setup time for the flip-flop structure 300 is not adversely effected by the introduction of additional capacitance at the output 315 of the master latch 310.

In the example illustrated in FIG. 3, the flip-flop structure 300 is a scan flip-flop structure. Accordingly, the input stage 330 includes a second, scan, input component 334. The scan input component 334 is arranged to receive at an input thereof a scan input signal 365 during a scan mode of operation when the flip-flop structure 300 is configured to form a part of a scan chain. An output of the scan input component 334 is also coupled substantially directly to the output 315 of the master latch 310.

In a similar manner to the LSSD flip-flop structure 200 illustrated in FIG. 2, by separating the scan input component 334 and the data input component 332 within the input stage 330, the scan input circuitry is removed from the data critical path 390. This enables the part of the input stage 330 within the data critical path 390 (i.e. the data input component 332) to be simplified. As a result, the delay time of the input stage 330 within the data critical path 390 may be reduced, thereby reducing the setup time of the flip-flop structure 300.

Figure 5:
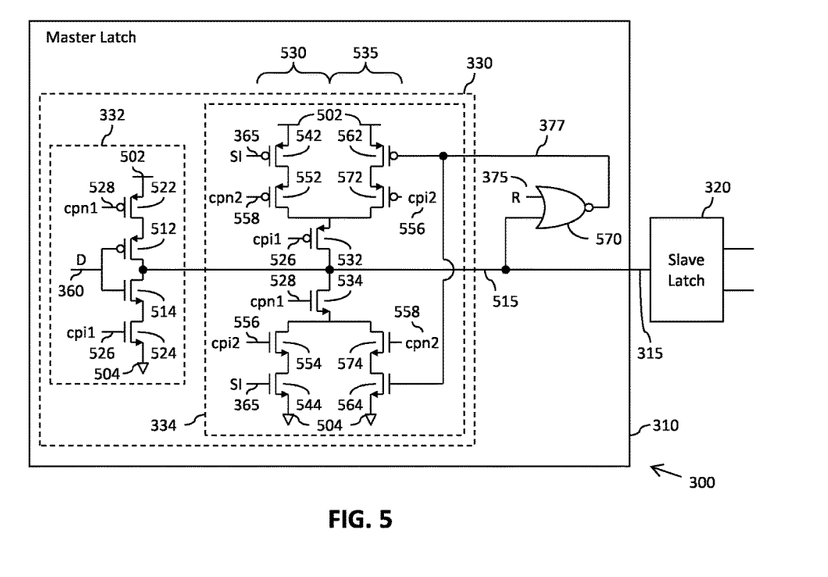
FIG. 5 schematically illustrates a circuit diagram of an example of the master latch of the flip-flop structure of FIG. 3.

FIG. 5 schematically illustrates a more detailed circuit diagram of an example of the master latch 310 of the flip-flop structure 300 of FIG. 3. In the example illustrated in FIG. 5, the data input component 332 of the input stage 330 includes a first high side and low side transistor pair, including a high side PMOS (P-channel metal oxide semiconductor) transistor 512 and a low side NMOS (N-channel metal oxide semiconductor) transistor 514, and a second high side and low side transistor pair, including a high side PMOS transistor 522 and a low side NMOS transistor 524. The high side transistors 512, 522 of the first and second transistor pairs of the data input component 332 are coupled in series between an output 515 of the input stage 330 (which is coupled to the output of the master latch 310) and a high voltage supply 502. The low side transistors 514, 524 of the first and second transistor pairs are coupled in series between the output 515 of the input stage 330 and a low voltage supply, which in the illustrated example is ground 504.

Gate terminals of the first transistor pair 512, 514 are arranged to receive the data input signal 360, whilst gate terminals of the second transistor pair 522, 524 are arranged to receive a first pair of timing signals 526, 528 derived from the clock signal 340. As described in greater detail below with reference to FIG. 6, the first pair of timing signals 526, 528 are derived such that:
- the second transistor pair 522, 524 of the data input component 332 are held in an off state, when the flip-flop structure 300 is configured to operate in the scan mode,
- the second transistor pair 522, 524 of the data input component 332 are configured into an off state during a second phase of the clock signal 340, when the flip-flop structure 300 is configured to operate in a functional mode (i.e. when not configured to operate in the scan mode), and
- the second transistor pair 522, 524 of the data input component 332 are configured in an on state during a first phase of the clock signal 340, when the flip-flop structure 300 is configured to operate in the functional mode.

In the example illustrated in FIG. 5, the scan input component 334 of the input stage 330 includes a scan mode driver circuit 530 and a feedback driver circuit 535. The scan mode driver circuit 530 is arranged to drive a logical state at the output 515 of the input stage 330 corresponding to a logical state of the scan input signal 365 during a first phase of the clock signal 340, when the flip-flop structure 300 is configured to operate in the scan mode. The feedback driver circuit 535 is arranged to drive a logical state at the output 515 of the input stage 330 based at least partly on a sampled logical state at the output 315 of the master latch 310 such that the sample logical state at the output 315 of the master latch 310 is maintained, during a second phase of the clock signal 340, as described in greater detail below.

The scan mode driver circuit 530 and the feedback driver circuit 535 have a shared high side and low side transistor pair 532, 534 coupled to the output 515 of the input stage 330, and through which the scan mode and feedback driver circuits 530, 535 are arranged to drive a logical state at the output 515 of the input stage 330.

Gate terminals of the shared transistor pair 532, 534 are arranged to receive a pair of timing signals derived from the clock signal 340, which in the illustrated example are the first pair of timing signals 526, 528 derived from the clock signal 340, in an opposing configuration to the gate terminals of the second transistor pair 522, 524 of the data input component 332. As described in greater detail below with reference to FIG. 6, the timing signals 526, 528 received at the gate terminals of the shared transistor pair 532, 534 are derived such that:

the shared transistor pair 532, 534 are held in an on state, when the flip-flop structure 300 is configured to operate in the scan mode, the shared transistor pair 532, 534 are configured in an off state during a first phase of the clock signal 340, when the flip-flop structure 300 is configured to operate in the functional mode, and the shared transistor pair 532, 534 are configured into an on state during a second phase of the clock signal 340, when the flip-flop structure 300 is configured to operate in the functional mode.

The scan mode driver circuit 530 further includes a scan input high side and low side transistor pair 542, 544 and a timing high side and low side transistor pair 552, 554. High side scan input and timing transistors 542, 552 of the scan mode driver circuit 530 are coupled in series between the high side transistor 532 of the shared transistor pair and the high voltage supply 502. Low side scan input and timing transistors 544, 554 of the scan mode driver circuit 530 are coupled in series between the low side transistor 534 of the shared transistor pair and the low voltage supply 504.

Gate terminals of the scan input high side and low side transistor pair 542, 544 are arranged to receive the scan input signal 365. Gate terminals of the timing high side and low side transistor pair 552, 554 are arranged to receive a pair of timing signals 556, 558 derived from the clock signal 340. As described in greater detail below with reference to FIG. 6, this (second) pair of timing signals 556, 558 are derived such that:

the timing transistor pair 552, 554 of the scan mode driver circuit 530 are held in an off state, when the flip-flop structure 300 is configured to operate in the functional mode, the timing transistor pair 552, 554 of the scan mode driver circuit 530 are configured in an on state during a first phase of the clock signal 340, when the flip-flop structure 300 is configured to operate in the scan mode, and the timing transistor pair 552, 554 of the scan mode driver circuit 530 are configured into an off state during a second phase of the clock signal 340, when the flip-flop structure 300 is configured to operate in the scan mode.

The feedback driver circuit 535 further includes a feedback high side and low side transistor pair 562, 564 and a timing high side and low side transistor pair 572, 574. High side feedback and timing transistors 562, 572 of the feedback driver circuit 535 are coupled in series between the high side transistor 532 of the shared transistor pair and the high voltage supply 502. Low side feedback and timing transistors 564, 574 of the feedback driver circuit 535 are coupled in series between the low side transistor 534 of the shared transistor pair and the low voltage supply 504.

Gate terminals of the feedback high side and low side transistor pair 562, 564 are arranged to receive the feedback signal 377 representative of a logical state at the output 315 of the master latch 310. Gate terminals of the timing high side and low side transistor pair 572, 574 are arranged to receive a pair of timing signals derived from the clock signal 340, which in the illustrated example are the second pair of timing signals 556, 558 derived from the clock signal 340, in an opposing configuration to the gate terminals of the timing transistor pair 552, 554 of the scan mode driver circuit 530. As described in greater detail below with reference to FIG. 6, the timing signals 556, 558 received at the gate terminals of the timing transistor pair 572, 574 of the feedback driver circuit 535 are derived such that:

the timing transistor pair 572, 574 of the feedback driver circuit 535 are held in an on state, when the flip-flop structure 300 is configured to operate in the functional mode, the timing transistor pair 572, 574 of the feedback driver circuit 535 are configured in an off state during a first phase of the clock signal 340, when the flip-flop structure 300 is configured to operate in the scan mode, and the timing transistor pair 572, 574 of the feedback driver circuit 535 are configured into an on state during a second phase of the clock signal 340, when the flip-flop structure 300 is configured to operate in the scan mode.

In the example illustrated in FIG. 5, the set/reset circuit 370 (FIG. 3) of the master latch 310 includes a NOR gate 570. The NOR gate 570 includes a first input coupled to the output 315 of the master latch 310, a second input arranged to receive the reset signal 375, and an output arranged to output the feedback signal 377 for the feedback component. Accordingly, the NOR gate 570 is arranged to drive a logical '0' state (a reset state) at its output when the reset signal 375 consists of a logical '1' state, and drive a logical state at its output opposite to the logical state sampled at its first input (i.e. the logical state at the output 315 of the master latch 310) when the reset signal 375 consists of a logical '0' state.

For the prior art scan flip-flop structures illustrated in FIGS. 1 and 2, the inclusion of such a set/reset circuit NOR gate within the data critical path results in an inverted logical state at the output 115 of the master latch 110 relative to the active input signal 160,165. However, by coupling the output 515 of the input stage 330 substantially directly to the output 315 of the master latch 310, a non-inverted logical state is provided at the output 315 of the master latch 310 relative to the active input signal 360,365 for the present invention. However, such a reversal of the polarity of the logical state provided at the output 315 of the master latch 310 requires no changes to the slave latch 320 apart from a reversal of the slave latch outputs.

It will be appreciated that the present invention is not limited to a set/reset circuit 370 consisting of a reset circuit in the form of a NOR gate 570. For example, the set/reset circuit 370 may alternatively consist of a reset circuit in the form of, say a NAND gate, whereby the NAND gate is arranged to drive a logical '1' state (a reset state) at its output when the reset signal 375 consists of a logical '0' state, and drive a logical state at its output opposite to the logical state sampled at its first input (i.e. the logical state at the output 315 of the master latch 310) when the reset signal 375 consists of a logical '1' state. Alternatively, the set/reset circuit 370 may consist of a reset circuit in the form of, say, an OR gate, whereby the OR gate is arranged to drive a logical '1' state (a reset state) at its output when the reset signal 375 consists of a logical '1' state, and drive a logical state at its output equivalent to the logical state sampled at its first input (i.e. the logical state at the output 315 of the master latch 310) when the reset signal 375 consists of a logical '0' state. Alternatively still, the reset circuit may consist of a reset circuit in the form of, say, an AND gate, whereby the AND gate is arranged to drive a logical '0' state (a reset state) at its output when the reset signal 375 consists of a logical '0' state, and drive a logical state at its output equivalent to the logical state sampled at its first input (i.e. the logical state at the output 315 of the master latch 310) when the reset signal 375 consists of a logical '1' state. For the examples where the set/reset circuit 370 consists of an OR gate or an AND gate, an inverter may be coupled to the output of the OR/AND gate to inverse the logical state output thereby to provide the feedback signal 377.

In some further alternative examples, the set/reset circuit 370 may consist of more complex set and reset circuitry. Alternatively, in some further examples the feedback component may have no set/reset circuitry 370, with the output 315 of the master component 310 being coupled directly to the feedback driver circuit 380, or via an inverter.

Figure 6:
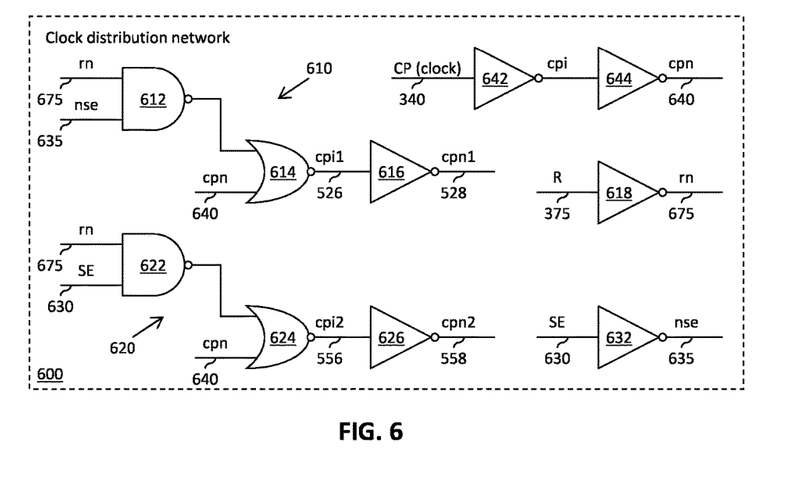
FIG. 6 illustrates an example of a clock distribution network arranged to derive timing signals used within the flip-flop structure illustrated in FIG. 5.

FIG. 6 illustrates an example of a clock distribution network 600 arranged to derive the various timing signals used within the flip-flop structure 300 illustrated in FIG. 5.

The clock distribution network 600 in the illustrated example includes a first sub-network 610 arranged to generate the first pair of timing signals 526, 528. The first sub-network 610 includes a NAND gate 612 arranged to receive at inputs thereof an inverse reset signal 675, which is generated by passing the reset signal 375 through an inverter 618, and an inverse scan enable signal 635, which is generated by passing a scan enable signal 630 through an inverter 632. In this manner, when either of the reset signal 375 or scan enable signal 630 has a logical '1' state, the resulting logical '0' state of the respective inverse reset/scan enable signal 675, 635 received at an input of the NAND gate 612 causes the NAND gate 612 to output a logical '1' state.

The output of the NAND gate 612 is provided to a first input of a NOR gate 614. The NOR gate 614 also receives at a second input thereof a timing signal 640 representative of the clock signal 340. In the illustrated example, the timing signal 640 is derived by passing the clock signal 340 through two inverters 642, 644. In practice, the clock signal 340 is typically an externally generated signal, whereby the rise and fall transition times are not controllable. Accordingly, passing the clock signal 340 through the two inverters 642, 644, a timing signal 640 representative of the clock signal 340 may be derived with required rise and fall times controllable through the configuration of the inverters 642, 644.

When either of the reset or scan enable signals has a logical '1' state, the resulting logical '1' state output by the NAND gate 612 is received at the first input of the NOR gate 614, and causes the NOR gate 614 to output a logical '0' state irrespective of the signal received at its second input. The output of the NOR gate 614 forms the basis of the first pair of timing signals 526, 528. Specifically in the illustrated example, the signal output by the NOR gate 614 provides the timing signal 526. An inverter 616 generates an inverted version of the timing signal 526 to provide the timing signal 528. Thus, when the reset signal 375 is set to a logical '1' state (to force the flip-flop structure 300 into a reset state) or when the scan enable signal 630 is set to a logical '1' state (to configure the flip-flop structure 300 into a scan mode of operation), the first pair of timing signals 526, 528 are held in logical '0' and '1' states respectively.

Accordingly, when one of the reset signal 375 or the scan enable signal 630 comprises a logical '1' state, the first pair of timing signals 526, 528 are held in logical '0' and '1' states respectively, forcing the second transistor pair 522, 524 of the data input component 332 to be held in an off state. When held in such an off state, the second transistor pair 522, 524 substantially prevent a conductive path being created there through, and thus prevent the data input component 332 from driving any logical state at its output.

By contrast, the shared transistor pair 532, 534 are arranged to receive the first pair of timing signals 526, 528 in an opposing configuration to the second transistor pair 522, 524 of the data input component 332. Accordingly, when the first pair of timing signals 526, 528 are held in logical '0' and '1' states respectively, the shared transistor pair 532, 534 are held in an on state. When held in such an on state, the shared transistor pair 532, 534 are substantially transparent, allowing the scan mode driver circuit 530 and the feedback driver circuit 535 to drive a logical state at the output 515 of the input stage 330.

Conversely, when both of the reset and scan enable signals 375, 630 have a logical '0' state, the resulting logical '0' state output by the NAND gate 612 is received at the first input of the NOR gate 614, and the NOR gate 614 outputs the inverse of the timing signal 640 received at its second input. The timing signal 640 is arranged to have a logical '1' state during a first phase of the clock signal 340 and a logical '0' state during a second phase of the clock signal. As a result, when both of the reset and scan enable signals 375, 630 have a logical '0' state:

the second transistor pair 522, 524 of the data input component 332 are configured in an on state and the shared transistor pair 532, 534 are configured in an off state, during a first phase of the clock signal 340; and the second transistor pair 522, 524 of the data input component 332 are configured in an off state and the shared transistor pair 532, 534 are configured in an on state, during a second phase of the clock signal 340.

As such, when both of the reset and scan enable signals 375, 630 have a logical '0' state, the output 515 of the input stage 330 is driven by the data input component 332 during a first phase of the clock signal 340 (i.e. when the clock signal 340 has a logical '0' state in the illustrated example) and by the scan input component 334 during a second phase of the clock signal (i.e. when the clock signal 340 has a logical '1' state in the illustrated example).

The clock distribution network 600 in the illustrated example includes a first sub-network 620 arranged to generate the second pair of timing signals 556, 558. The second sub-network 620 includes a NAND gate 622 arranged to receive at inputs thereof the inverse reset signal 675 and the scan enable signal 630. In this manner, when either the inverse reset signal 675 or the scan enable signal 630 has a logical '0' state, the NAND gate 622 outputs a logical '1' state.

The output of the NAND gate 622 is provided to a first input of a NOR gate 624. The NOR gate 624 also receives at a second input thereof the timing signal 640 representative of the clock signal 340. In this manner, when either the reset signal has a logical '1' state or the scan enable signal 630 has a logical '0' state, the resulting logical '1' state output by the NAND gate 622 is received at the first input of the NOR gate 624, and causes the NOR gate 624 to output a logical '0' state irrespective of the signal received at its second input. The output of the NOR gate 624 forms the basis of the second pair of timing signals 556, 558. Specifically in the illustrated example, the signal output by the NOR gate 624 provides the timing signal 556. An inverter 626 generates an inverted version of the timing signal 556 to provide the timing signal 558. Thus, when the reset signal 375 is set to a logical '1' state (to force the flip-flop structure 300 into a reset state) or when the scan enable signal 630 is set to a logical '0' state (to configure the flip-flop structure 300 into a function mode of operation), the second pair of timing signals 556, 558 are held in logical '0' and '1' states respectively.

In this manner, when the second pair of timing signals 556, 558 are held in logical '0' and '1' states respectively, the timing transistor pair 552, 554 of the scan mode driver circuit 530 are held in an off state. When held in such an off state, the timing transistor pair 552, 554 of the scan mode driver circuit 530 substantially prevent a conductive path being created there through, and thus prevent the scan mode driver circuit 530 from driving any logical state at the output 515 of the input stage 330. By contrast, when the second pair of timing signals 556, 558 are held in logical '0' and '1' states respectively, the timing transistor pair 572, 574 of the feedback driver circuit 535 are held in an on state. When held in such an on state, the timing transistor pair 572, 574 of the feedback driver circuit 535 are substantially transparent, allowing the feedback high side and low side transistor pair 562, 564 to drive a logical state at the output 515 of the input stage 330, dependent on the state of the shared transistor pair 532, 534.

More specifically, when either the reset signal has a logical '1' state or the scan enable signal 630 has a logical '0' state, the output 515 of the input stage 330 is driven alternately by the first transistor pair 512, 514 of the data input component 332 and the feedback transistor pair 562, 564, during alternate first and second phases of the clock signal 340.

Conversely, when the reset signal 375 has a logical '0' state and the scan enable signal has a logical '1' state, the resulting logical '0' state output by the NAND gate 622 is received at the first input of the NOR gate 624, and the NOR gate 624 outputs the inverse of the timing signal 640 received at its second input. The timing signal 640 is arranged to have a logical '1' state during a first phase of the clock signal 340 and a logical '0' state during a second phase of the clock signal. As a result, when the reset signal 375 has a logical '0' state and the scan enable signal has a logical '1' state:

the timing transistor pair 552, 554 of the scan mode driver circuit 530 are configured in an on state, during a first phase of the clock signal 340, the timing transistor pair 552, 554 of the scan mode driver circuit 530 are configured into an off state, during a second phase of the clock signal 340, the timing transistor pair 572, 574 of the feedback driver circuit 535 are configured in an off state during a first phase of the clock signal 340, when the flip-flop structure 300 is configured to operate in the scan mode, and the timing transistor pair 572, 574 of the feedback driver circuit 535 are configured into an on state during a second phase of the clock signal 340, when the flip-flop structure 300 is configured to operate in the scan mode.

As such, when the reset signal 375 has a logical '0' state and the scan enable signal has a logical '1' state, the output 515 of the input stage 330 is driven alternately by the scan input transistor pair 542, 544 of the scan mode driver circuit 530 and the feedback transistor pair 562, 564 of the feedback driver circuit 535, during alternate first and second phases of the clock signal 340.

Figure 7:
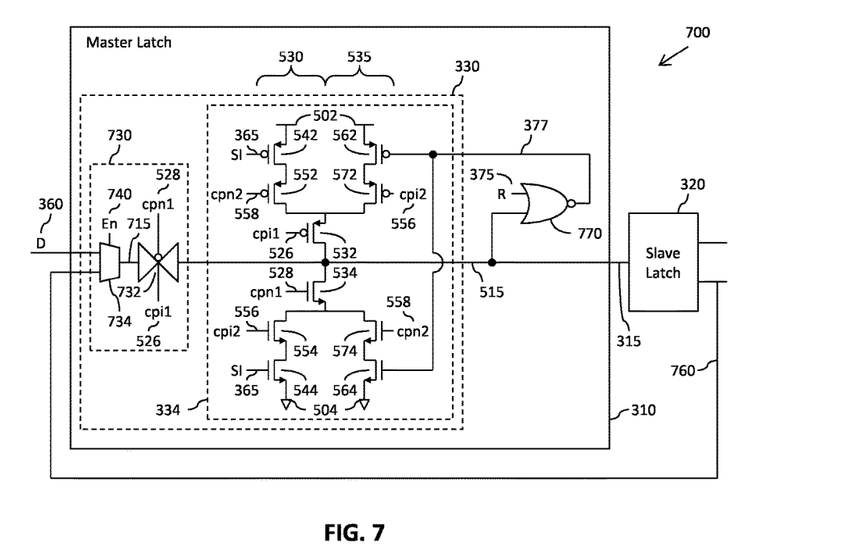
FIG. 7 schematically illustrates a circuit diagram of an alternative example of a flip-flop structure.

Referring now to FIG. 7, there is schematically illustrated a circuit diagram of an alternative example of a flip-flop structure 700, in which the flip-flop structure 700 of FIG. 7 is arranged to be enabled/disabled by way of an enable signal 740.

For clarity and ease of understanding, reference numerals relating to corresponding components and signals have been retained from FIGS. 3 to 5. In a similar manner to the flip-flop structure 300 illustrated in FIGS. 3 to 5, the flip-flop structure 700 illustrated in FIG. 7 includes two latches coupled in series. A first, master latch 310 is provided ahead of a second, slave latch 320 in the data path.

The master latch 310 includes an input stage 330. The input stage 330 includes a first, data, input component 730. The data input component 730 is arranged to receive at an input thereof a data signal 360 during normal functional operation of an integrated circuit of which the flip-flop structure 300 forms a part. An output of the data input component 730 is coupled substantially directly to the output 315 of the master latch 310.

In the example illustrated in FIG. 7, the flip-flop structure 700 is a scan flip-flop structure. Accordingly, the input stage 330 includes a second, scan input component 334. The scan input component 334 is arranged to receive at an input thereof a scan input signal 365 during a scan mode of operation when the flip-flop structure 300 is configured to form a part of a scan chain. An output of the scan input component 334 is also coupled substantially directly to the output 315 of the master latch 310.

The master latch 310 further includes a reset circuit in the form of a NOR gate 770. As for the flip-flop structure 300 illustrated in FIGS. 3 to 5, the reset circuit (NOR gate) 770 of the master latch 310 of the flip-flop structure 700 illustrated in FIG. 7 is not located within a critical data path between the data input signal 360 and the input of the slave latch 320. As a result, the setup time of the flip-flop structure 700 illustrated in FIG. 7 is not affected by any delay of the reset circuit 370. Thus, the setup time of the flip-flop structure 700 is only defined by the delay of the data input component 730. Accordingly, the setup time for the flip-flop structure 700 illustrated in FIG. 7 may be significantly reduced as compared with the setup times for the prior art flip-flop structures illustrated in FIGS. 1 and 2.

The master latch 310 is synchronised to a clock signal 340 (not shown) that synchronises the operation of the master latch 310.

The scan input component 334 of the flip-flop structure 700 illustrated in FIG. 7 is substantially the same as the scan input component 334 of the flip-flop structure 300 illustrated in FIG. 5 and described above. Accordingly, the scan input component 334 of the flip-flop structure 700 illustrated in FIG. 7 need not be described in any further detail.

The data input component 730 of the flip-flop structure 700 illustrated in FIG. 7 includes a data input driver circuit 732 arranged to receive at an input thereof a data signal 715 during normal functional operation of an integrated circuit of which the flip-flop structure 700 forms a part. An output of the data input driver circuit 732 is coupled substantially directly to the output 515 of the input stage 330. In some examples, the data input driver circuit 732 may be implemented as being substantially the same as the data input component 332 of the flip-flop structure 300 illustrated in FIG. 5 and described above. Accordingly, the data input driver circuit 732 of the flip-flop structure 700 illustrated in FIG. 7 need not be described in any further detail.

In the example illustrated in FIG. 7, the data input component 730 further includes a multiplexer component 734. The multiplexer component 734 is arranged to receive the data input signal 360 at a first data input thereof, and an output signal 760 of the slave latch 320 at a second data input thereof. The multiplexer component 734 is further arranged to receive an enable signal 740 at a control input thereof, and to output the data signal 715 received at the input of the data input driver circuit 732. In this manner, the enable signal 740 may be used to control which of the data input signal 360 or the output signal 760 of the slave latch 320 is passed through the multiplexer component 734 to the data input driver circuit 732. In this manner, the enable signal may be 'set' to cause the data input signal 360 to be passed through the multiplexer component 734 to the data input driver circuit 732, thereby enabling the flip-flop structure 700. Conversely, the flip-flop structure 700 may be disabled by 'un-setting' the enable signal 740 such that the output signal 760 of the slave latch 320 is passed through the multiplexer component 734 to the data input driver circuit 732, thereby looping the logical state at the output of the slave latch 320 back into the input of the master latch 310 to maintain the current state of the flip-flop structure 700.

Figure 8:
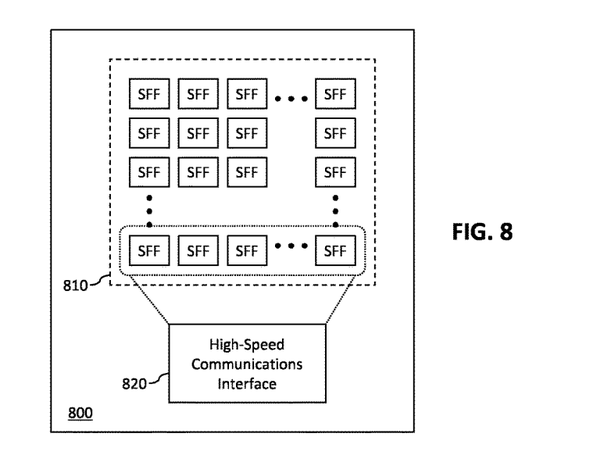
FIG. 8 illustrates a simplified block diagram of an example of an integrated circuit device having a plurality of scan flip-flop structures.

Referring now to FIG. 8, there is illustrated a simplified block diagram of an example of an integrated circuit device 800 having a plurality of scan flip-flop structures, indicated generally at 810. The scan flip-flop structures 810 are configurable to operate in a first, functional mode and a second, scan mode in which the scan flip-flop structures 810 are arranged into one or more scan chains. In accordance with some examples of the present invention, one or more of the scan flip-flops structures 810 is/are implemented by way of one or more of the flip-flop structures 300, 700 illustrated in FIGS. 3, 5 and/or 7.

In the example illustrated in FIG. 8, at least a subset of the scan flip-flop structures 810 form a part of a high-speed communications interface 820, for example a high-speed link layer communications protocol interface.

The present invention has been hereinbefore described and illustrated with reference to a scan flip-flop structure 300. However, it will be appreciated that the present invention is not limited solely to scan flip-flop structures, and it is contemplated that the inventive concept may equally be applied to non-scan flip-flop structures (i.e. not having scan input components).

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'coupled,' to each other to achieve the desired functionality.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

We claim:

1. A flip-flop structure comprising a master latch and a slave latch coupled in series such that an output of the master latch is coupled to a data input of the slave latch; the master latch comprising:
   an input stage arranged to receive a data input signal, wherein an output of the input stage is coupled to the output of the master latch to drive a logical state at the output of the master latch corresponding to a logical state of the data input signal during a first phase of a clock signal, wherein a logical state at an output of the input stage of the master latch is the same as the logical state at the output of the master latch during the first phase of the clock signal; and
   a feedback component, coupled to the output of the master latch, and arranged to sample a logical state at the output of the master latch and to drive a logical state at the output of the master latch based at least partly on the sampled logical state at the output of the master latch such that the sampled logical state at the output of the master latch is maintained during a second phase of the clock signal.

2. The flip-flop structure of claim 1, wherein the input stage comprises:
   a data input component arranged to receive a data input signal, wherein the data input component is arranged to drive a logical state at the output of the master latch corresponding to a logical state of the data input signal during a first phase of the clock signal, when the flip-flop structure is configured to operate in a functional mode; and
   a scan input component arranged to receive a scan input signal, wherein the scan input component is arranged to drive a logical state at the output of the master latch corresponding to a logical state of the scan input signal during the first phase of the clock signal, when the flip-flop structure is configured to operate in a scan mode.

3. The flip-flop structure of claim 2, wherein the scan input component comprises:
   a scan mode driver circuit arranged to drive a logical state at the output of the input stage corresponding to a logical state of the scan input signal during the first phase of the clock signal, when the flip-flop structure is configured to operate in the scan mode; and
   a feedback driver circuit arranged to drive a logical state at the output of the input stage based at least partly on the sampled logical state at the output of the master latch such that the sample logical state at the output of the master latch is maintained, during a second phase of the clock signal.

4. The flip-flop structure of claim 3, wherein the scan mode driver circuit and the feedback driver circuit comprise a shared high side and low side transistor pair coupled to the output of the input stage, and the scan mode and feedback driver circuits are arranged to drive a logical state at the output of the input stage through the shared high side and low side transistor pair.

5. The flip-flop structure of claim 4, wherein gate terminals of the shared high side and low side transistor pair are arranged to receive a pair of timing signals derived from the clock signal such that:
   the shared transistor pair are held in an on state, when the flip-flop structure is configured to operate in the scan mode,
   the shared transistor pair are configured into an on state during a second phase of the clock signal, when the flip-flop structure is configured to operate in the functional mode, and
   the shared transistor pair are configured in an off state during a first phase of the clock signal, when the flip-flop structure is configured to operate in the functional mode.

6. The flip-flop structure of claim 2, wherein the data input component comprises a first high side and low side transistor pair and a second high side and low side transistor pair;
   high side transistors of the first and second transistor pairs of the data input component being coupled in series between the output of the input stage and a high voltage supply;
   low side transistors of the first and second transistor pairs of the data input component being coupled in series between the output of the input stage and a low voltage supply;
   gate terminals of the first high side and low side transistor pair being arranged to receive the data input signal; and
   gate terminals of the second high side and low side transistor pair being arranged to receive a pair of timing signals derived from the clock signal such that:
      the second transistor pair are held in an off state, when the flip-flop structure is configured to operate in the scan mode,
      the second transistor pair are configured into an off state during a second phase of the clock signal, when the flip-flop structure is configured to operate in the functional mode, and
      the second transistor pair are configured in an on state during a first phase of the clock signal, when the flip-flop structure is configured to operate in the functional mode.

7. The flip-flop structure of claim 4, wherein the feedback driver circuit further comprises a feedback high side and low side transistor pair and a timing high side and low side transistor pair;
   high side transistors of the feedback and timing transistor pairs of the feedback driver circuit being coupled in series between the high side transistor of the shared transistor pair and a high voltage supply;
   low side transistors of the feedback and timing transistor pairs of the feedback driver circuit being coupled in series between the low side transistor of the shared transistor pair and a low voltage supply;
   gate terminals of the feedback high side and low side transistor pair being arranged to receive a feedback signal representative of a logical state at the output of the master latch, and
   gate terminals of the timing high side and low side transistor pair being arranged to receive a pair of timing signals derived from the clock signal such that:
      the timing transistor pair are held in an on state, when the flip-flop structure is configured to operate in the functional mode, the timing transistor pair are configured into an on state during a second phase of the clock signal, when the flip-flop structure is configured to operate in the scan mode, and the second transistor pair are configured in an off state during a first phase of the clock signal, when the flip-flop structure is configured to operate in the scan mode.

8. The flip-flop structure of claim 4, wherein the scan mode driver circuit further comprises a scan input high side and low side transistor pair and a timing high side and low side transistor pair;

high side transistors of the scan input and timing transistor pairs of the scan mode driver circuit being coupled in series between the high side transistor of the shared transistor pair and a high voltage supply;

low side transistors of the scan input and timing transistor pairs of the scan mode driver circuit being coupled in series between the low side transistor of the shared transistor pair and a low voltage supply;

gate terminals of the scan input high side and low side transistor pair being arranged to receive the scan input signal; and gate terminals of the timing high side and low side transistor pair being arranged to receive a pair of timing signals derived from the clock signal such that:

the timing transistor pair are held in an off state, when the flip-flop structure is configured to operate in the functional mode, the timing transistor pair are configured into an off state during a second phase of the clock signal, when the flip-flop structure is configured to operate in the scan mode, and the timing transistor pair are configured in an on state during a first phase of the clock signal, when the flip-flop structure is configured to operate in the scan mode.

9. The flip-flop structure of claim 1, wherein the master latch further comprises a reset circuit, the reset circuit comprising a first input coupled to the output of the master latch, a second input arranged to receive a reset signal, and an output arranged to output a feedback signal for the feedback component; the reset circuit being arranged to:

drive a reset logical state at its output when the reset signal comprises a first logical state, and drive a logical state at its output based on a logical state sampled at its first input, when the reset signal comprises a second logical state.

10. The flip-flop structure of claim 1, wherein the input stage is substantially transparent, and no component is located within a critical path of the master latch.

11. An integrated circuit device comprising a master latch and a slave latch coupled in series to form a flip-flop structure such that an output of the master latch is coupled to a data input of the slave latch; the master latch comprising:

an input stage arranged to receive a data input signal, wherein an output of the input stage is coupled to the output of the master latch to drive a logical state at the output of the master latch corresponding to a logical state of the data input signal during a first phase of a clock signal, wherein a logical state at an output of the input stage of the master latch is the same as the logical state at the output of the master latch during the first phase of the clock signal; and a feedback component, coupled to the output of the master latch, and arranged to sample a logical state at the output of the master latch and to drive a logical state at the output of the master latch based at least partly on the sampled logical state at the output of the master latch;

the input stage is arranged to drive a logical state at the output of the master latch such that the sampled logical state at the output of the master latch is maintained during a second phase of the clock signal.

12. The integrated circuit device of claim 11, wherein the input stage of the master latch comprises:

a data input component arranged to receive a data input signal, wherein the data input component is arranged to drive a logical state at the output of the master latch corresponding to a logical state of the received data input signal during a first phase of the clock signal, when the flip-flop structure is configured to operate in a functional mode; and a scan input component arranged to receive a scan input signal, wherein the scan input component is arranged to drive a logical state at the output of the master latch corresponding to a logical state of the received scan input signal during a first phase of the clock signal, when the flip-flop structure is configured to operate in a scan mode.

13. The integrated circuit device of claim 12, wherein the scan input component comprises:

a scan mode driver circuit arranged to drive a logical state at the output of the input stage corresponding to a logical state of the scan input signal during the first phase of the clock signal, when the flip-flop structure is configured to operate in the scan mode; and a feedback driver circuit arranged to drive a logical state at the output of the input stage based at least partly on the sampled logical state at the output of the master latch such that the sample logical state at the output of the master latch is maintained, during a second phase of the clock signal.

14. The integrated circuit device of claim 13, wherein the scan mode driver circuit and the feedback driver circuit comprise a shared high side and low side transistor pair coupled to the output of the input stage, and the scan mode and feedback driver circuits are arranged to drive a logical state at the output of the input stage through the shared high side and low side transistor pair.

15. The integrated circuit device of claim 14, wherein gate terminals of the shared high side and low side transistor pair are arranged to receive a pair of timing signals derived from the clock signal such that:

the shared transistor pair are held in an on state, when the flip-flop structure is configured to operate in the scan mode, the shared transistor pair are configured into an on state during a second phase of the clock signal, when the flip-flop structure is configured to operate in the functional mode, and the shared transistor pair are configured in an off state during a first phase of the clock signal, when the flip-flop structure is configured to operate in the functional mode.

16. The integrated circuit device of claim 14, wherein the feedback driver circuit further comprises a feedback high side and low side transistor pair and a timing high side and low side transistor pair;

high side transistors of the feedback and timing transistor pairs of the feedback driver circuit being coupled in series between the high side transistor of the shared transistor pair and a high voltage supply;

low side transistors of the feedback and timing transistor pairs of the feedback driver circuit being coupled in series between the low side transistor of the shared transistor pair and a low voltage supply;

gate terminals of the feedback high side and low side transistor pair being arranged to receive a feedback signal representative of a logical state at the output of the master latch, and gate terminals of the timing high side and low side transistor pair being arranged to receive a pair of timing signals derived from the clock signal such that:

the timing transistor pair are held in an on state, when the flip-flop structure is configured to operate in the functional mode, the timing transistor pair are configured into an on state during a second phase of the clock signal, when the flip-flop structure is configured to operate in the scan mode, and the second transistor pair are configured in an off state during a first phase of the clock signal, when the flip-flop structure is configured to operate in the scan mode.

17. The integrated circuit device of claim 12, wherein the data input component comprises a first high side and low side transistor pair and a second high side and low side transistor pair;

high side transistors of the first and second transistor pairs of the data input component being coupled in series between the output of the input stage and a high voltage supply;

low side transistors of the first and second transistor pairs of the data input component being coupled in series between the output of the input stage and a low voltage supply;

gate terminals of the first high side and low side transistor pair being arranged to receive the data input signal; and gate terminals of the second high side and low side transistor pair being arranged to receive a pair of timing signals derived from the clock signal such that:

the second transistor pair are held in an off state, when the flip-flop structure is configured to operate in the scan mode, the second transistor pair are configured into an off state during a second phase of the clock signal, when the flip-flop structure is configured to operate in the functional mode, and the second transistor pair are configured in an on state during a first phase of the clock signal, when the flip-flop structure is configured to operate in the functional mode.

18. The integrated circuit device of claim 11, wherein the master latch further comprises a reset circuit, the reset circuit comprising a first input coupled to the output of the master latch, a second input arranged to receive a reset signal, and an output arranged to output a feedback signal for the feedback component; the reset circuit being arranged to:

drive a reset logical state at its output when the reset signal comprises a first logical state, and drive a logical state at its output based on a logical state sampled at its first input, when the reset signal comprises a second logical state.

19. A latch for a flip-flop structure, the latch comprising:

an input stage arranged to receive a data input signal, wherein an output of the input stage is coupled to the output of the latch to drive a logical state at the output of the latch corresponding to a logical state of the data input signal during a first phase of a clock signal, wherein a logical state at an output of the input stage of the master latch is the same as the logical state at the output of the master latch during the first phase of the clock signal; and a feedback component, coupled to the output of the latch, and arranged to sample a logical state at the output of the latch and to drive a logical state at the output of the latch based at least partly on the sampled logical state at the output of the latch such that the sampled logical state at the output of the latch is maintained during a second phase of the clock signal.

20. The latch of claim 19, wherein the input stage comprises:

a data input component arranged to receive a data input signal, wherein the data input component is arranged to drive a logical state at the output of the latch corresponding to a logical state of the received data input signal during a first phase of the clock signal, when the flip-flop structure is configured to operate in a functional mode; and a scan input component arranged to receive a scan input signal, wherein the scan input component is arranged to drive a logical state at the output of the latch corresponding to a logical state of the received scan input signal during a first phase of the clock signal, when the flip-flop structure is configured to operate in a scan mode.

* * * * *